United States Patent
Wada et al.

(10) Patent No.: US 8,728,877 B2
(45) Date of Patent: May 20, 2014

(54) METHOD FOR MANUFACTURING SILICON CARBIDE SEMICONDUCTOR DEVICE WITH A SINGLE CRYSTAL SUBSTRATE

(71) Applicant: Sumitomo Electric Industries, Ltd., Osaka (JP)

(72) Inventors: Keiji Wada, Osaka (JP); Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/687,883

(22) Filed: Nov. 28, 2012

(65) Prior Publication Data

US 2013/0171778 A1  Jul. 4, 2013

Related U.S. Application Data

(60) Provisional application No. 61/581,434, filed on Dec. 29, 2011.

(30) Foreign Application Priority Data

Dec. 29, 2011 (JP) .................. 2011-290203

(51) Int. Cl.
*H01L 21/332* (2006.01)
*H01L 21/30* (2006.01)
*H01L 21/46* (2006.01)
*H01L 29/15* (2006.01)

(52) U.S. Cl.
USPC .......... 438/136; 438/133; 438/134; 438/135; 438/137; 438/138; 438/139; 438/140; 438/458; 438/459; 257/77

(58) Field of Classification Search
None
See application file for complete search history.

(56) References Cited

U.S. PATENT DOCUMENTS

| | | | |
|---|---|---|---|
| 2008/0296771 A1* | 12/2008 | Das et al. | 257/758 |
| 2008/0315250 A1 | 12/2008 | Onozawa | |
| 2012/0280363 A1 | 11/2012 | Sumida et al. | |

FOREIGN PATENT DOCUMENTS

| | | |
|---|---|---|
| JP | 2002-280531 A | 9/2002 |
| JP | 2006-179662 A | 7/2006 |
| JP | 2008-288349 A | 11/2008 |
| JP | 2010-529646 A | 8/2010 |
| JP | 2011-066390 | 3/2011 |
| JP | 2011-151428 A | 8/2011 |
| WO | WO-00/16382 A1 | 3/2000 |
| WO | WO-2008/156516 A2 | 12/2008 |
| WO | WO-2011/007483 A1 | 1/2011 |

OTHER PUBLICATIONS

International Search Report and Written Opinion in International Application No. PCT/JP2012/077939 dated Jan. 15, 2013.

* cited by examiner

*Primary Examiner* — Michael Jung
*Assistant Examiner* — Jay C Chang
(74) *Attorney, Agent, or Firm* — Venable LLP; Michael A. Sartori; Tamatane J. Aga

(57) ABSTRACT

On a single-crystal substrate, a drift layer is formed. The drift layer has a first surface facing the single-crystal substrate, and a second surface opposite to the first surface, is made of silicon carbide, and has first conductivity type. On the second surface of the drift layer, a collector layer made of silicon carbide and having second conductivity type is formed. By removing the single-crystal substrate, the first surface of the drift layer is exposed. A body region and an emitter region are formed. The body region is disposed in the first surface of the drift layer, and has the second conductivity type different from the first conductivity type. The emitter region is disposed on the body region, is separated from the drift layer by the body region, and has first conductivity type.

9 Claims, 3 Drawing Sheets

METHOD FOR MANUFACTURING SILICON CARBIDE SEMICONDUCTOR DEVICE WITH A SINGLE CRYSTAL SUBSTRATE

BACKGROUND OF THE INVENTION

1. Field of the Invention

The present invention relates to a method for manufacturing a silicon carbide semiconductor device.

2. Description of the Background Art

Japanese Patent Laying-Open No. 2008-288349 discloses an n type IGBT (Insulated Gate Bipolar Transistor) employing a silicon substrate. Such an IGBT has a p type collector layer, which is formed by means of ion implantation and heat treatment after forming a structure of emitter side on the silicon substrate.

In recent years, instead of a silicon substrate, use of a silicon carbide substrate has been considered as a substrate for a power semiconductor device. An impurity provided in silicon carbide (SiC) by means of ion implantation is activated normally at a heat treatment temperature of approximately 1500° C. or greater, which is much higher than the heat treatment temperature for activating an impurity provided in silicon by means of ion implantation. Accordingly, if the technique of Japanese Patent Laying-Open No. 2008-288349 is applied to a method for manufacturing an IGBT using a silicon carbide substrate, the structure of emitter side is damaged due to the high-temperature heating. Accordingly, it is difficult to apply this technique.

According to Japanese National Patent Publication No. 2010-529646, a p type silicon carbide epitaxial layer is formed on an n type silicon carbide substrate, and then a structure of semiconductor device is formed, and then at least a portion of the n type silicon carbide substrate is removed.

In the case where an IGBT is manufactured using the technique described in Japanese National Patent Publication No. 2010-529646, in consideration of step variation, a portion of the collector layer has to be inevitably removed to securely expose the p type silicon carbide epitaxial layer (collector layer) by the removal of the silicon carbide substrate. As a result, the thickness of the collector layer is varied to result in variation of characteristics among semiconductor devices.

SUMMARY OF THE INVENTION

The present invention has been made to solve the foregoing problem, and has its object to provide a method for manufacturing a silicon carbide semiconductor device so as to achieve small variation of characteristics.

A method for manufacturing a silicon carbide semiconductor device in the present invention includes the following steps. A drift layer is formed on a single-crystal substrate. The drift layer has a first surface facing the single-crystal substrate and a second surface opposite to the first surface. The drift layer is made of silicon carbide and has first conductivity type. A collector layer is formed on the second surface of the drift layer. The collector layer is made of silicon carbide and has second conductivity type. The first surface of the drift layer is exposed by removing the single-crystal substrate. A body region and an emitter region are formed. The body region is disposed in the first surface of the drift layer and has the second conductivity type different from the first conductivity type. The emitter region is disposed on the body region, is separated from the drift layer by the body region, and has the first conductivity type. A gate insulating film is formed on the body region so as to connect the drift layer and the emitter region to each other. A gate electrode is formed on the gate insulating film. An emitter electrode is formed in contact with each of the emitter region and the body region.

According to this manufacturing method, the collector layer is formed on the single-crystal substrate with the drift layer interposed therebetween. Hence, when removing the single-crystal substrate, the collector layer can be avoided from being partially removed. Accordingly, the thickness of the collector layer can be avoided from being varied due to variation in the step of removing the single-crystal substrate. In this way, the variation in thickness of the collector layer in the silicon carbide semiconductor device can be suppressed. Accordingly, variation of characteristics can be suppressed among silicon carbide semiconductor devices.

In the above-described manufacturing method, the single-crystal substrate may be made of silicon carbide. Accordingly, both the single-crystal substrate and the drift layer formed thereon are made of silicon carbide. This facilitates formation of the drift layer having higher quality.

In the above-described manufacturing method, the single-crystal substrate may have the first conductivity type. Accordingly, both the single-crystal substrate and the drift layer formed thereon have the first conductivity type. In other words, the conductivity type of the single-crystal substrate and the conductivity type of the drift layer formed thereon are the same. This facilitates formation of the drift layer having higher quality.

In the above-described manufacturing method, the first conductivity type may be n type. Accordingly, a channel controlled by the gate electrode can be of n type. Hence, electrons having higher mobility than positive holes can be employed as carriers in this channel.

In the above-described manufacturing method, when forming the collector layer, impurity ions may be implanted. Thus, the collector layer can be formed using the ion implantation method.

In the above-described manufacturing method, when forming the collector layer, silicon carbide may be grown while adding a conductive impurity thereto. In this way, at least a part of the conductive impurity in the collector layer can be added without using the ion implantation method.

In the above-described manufacturing method, a field stop layer may be formed on the second surface of the drift layer. The field stop layer has the first conductivity type and has an impurity concentration higher than that of the drift layer. By the step of forming the field stop layer and the step of forming the collector layer, the field stop layer is formed to be disposed on the drift layer and the collector layer is formed to be disposed on the field stop layer. With the field stop layer, a depletion layer extending from the body region to the drift layer can be suppressed from reaching the collector layer.

In the above-described manufacturing method, the drift layer may have crystallinity higher than that of the collector layer. Accordingly, in the drift layer, loss of a current flowing in the silicon carbide semiconductor device can be suppressed, thus attaining effective conductivity modulation by sufficient carrier life.

In the above-described manufacturing method, the collector layer may have an impurity concentration of $1 \times 10^{18}/cm^3$ or greater. Thus, more sufficient amount of carriers can be supplied from the collector layer into the drift layer.

As described above, according to the present invention, a silicon carbide semiconductor device can be manufactured to achieve small variation of characteristics.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Regarding crystallographic indications of the present specification, an individual plane is represented by ( ) and a group plane is represented by { }. In addition, a negative index is supposed to be crystallographically indicated by putting "-" (bar) above a numeral, but is indicated by putting the negative sign before the numeral in the present specification. Further, in the present specification, an expression such as "a first structure is disposed on a second structure" is intended to indicate both a case where the first structure is disposed in direct contact with the second structure and a case where the first structure is disposed in indirect contact with the second structure with a third structure interposed therebetween, unless otherwise noted. The following describes an embodiment of the present invention with reference to figures.

Figure 1:
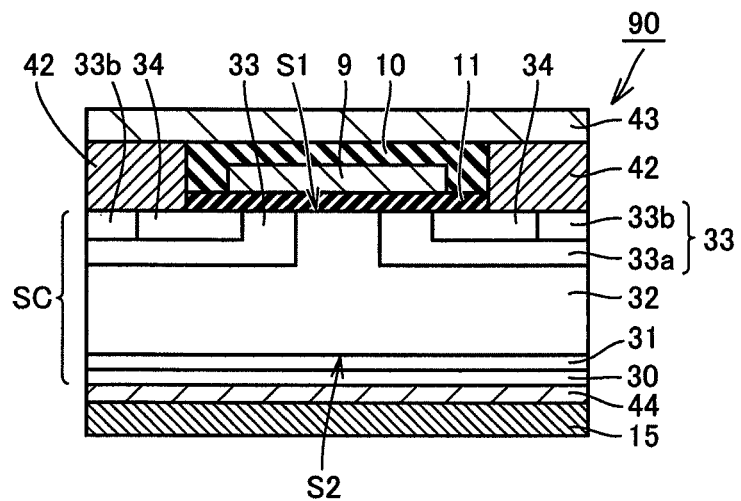
FIG. 1 is a cross sectional view schematically showing a configuration of a silicon carbide semiconductor device in a first embodiment of the present invention.

As shown in FIG. 1, an IGBT 90 (silicon carbide semiconductor device) of the present embodiment includes a silicon carbide layer SC, a gate insulating film 11, a gate electrode 9, emitter electrodes 42, an emitter wire 43, a collector electrode 44, an interlayer insulating film 10, and a protecting electrode 15.

Silicon carbide layer SC is made of silicon carbide having a hexagonal crystal structure or silicon carbide having a cubic crystal form. Silicon carbide layer SC has a region of n type (first conductivity type) and a region of p type (second conductivity type). Specifically, silicon carbide layer SC has a p type collector layer 30, an n type field stop layer 31, an n type drift layer 32, p type body regions 33, and n type emitter regions 34. Preferably, silicon carbide layer SC has a thickness of 30 nm or greater.

N type drift layer 32 preferably has a thickness of not less than 50 nm and not more than 200 nm. N type drift layer 32 has a surface 51 (first surface) and a surface S2 (second surface). N type field stop layer 31 is provided on surface S2 of n type drift layer 32. It should be noted that n type field stop layer 31 may not be provided.

P type collector layer 30 is provided on n type field stop layer 31. In other words, p type collector layer 30 is provided on surface S2 of n type drift layer 32 with n type field stop layer 31 interposed therebetween. P type collector layer 30 has a thickness of, for example, 1 nm. It should be noted that in the case where n type field stop layer 31 is not provided, p type collector layer 30 can be provided directly on surface S2 of n type drift layer 32.

Each of p type body regions 33 is provided in surface Si of the n type drift layer. Further, p type body region 33 has a p region 33a, and a $p^+$ region 33b. $P^+$ region 33b has an impurity concentration higher than that of p region 33a. P region 33a is in contact with gate insulating film 11. $P^+$ region 33b is in contact with emitter electrode 42.

N type emitter regions 34 are provided on p type body regions 33. Further, n type emitter regions 34 are separated from n type drift layer 32 by p type body regions 33.

Gate insulating film 11 is provided on p type body region 33 so as to connect n type drift layer 32 and n type emitter regions 34 to one another. Gate insulating film 11 is made of, for example, silicon oxide ($SiO_2$) formed by a thermal oxidation method. Gate electrode 9 is provided on gate insulating film 11.

Emitter electrode 42 is in contact with each of n type emitter region 34 and $p^+$ region 33b of p type body region 33. Emitter wire 43 is provided on emitter electrode 42 and is electrically connected to emitter electrode 42. Emitter wire 43 is made of, for example, aluminum.

Collector electrode 44 is an ohmic electrode in contact with p type collector layer 30. Collector electrode 44 includes: a Ni layer facing surface S2; and a Au layer provided on the Ni layer, for example. Instead of the Ni layer and the Au layer, a Ti layer and an Al layer may be used, respectively. Protecting electrode 15 covers collector electrode 44.

The following describes gist of usage of IGBT 90. A voltage is applied between emitter wire 43 and protecting electrode 15 such that protecting electrode 15 has a positive potential relative to emitter wire 43. Electric conduction between emitter wire 43 and protecting electrode 15 is switched in accordance with a potential applied to gate electrode 9.

Specifically, when gate electrode 9 is fed with a positive potential exceeding a threshold value, an inversion layer is formed in each p type body region 33 at a region (channel region) facing gate electrode 9 with gate insulating film 11 interposed therebetween. Accordingly, n type emitter region 34 and n type drift layer 32 are electrically connected to each other. Accordingly, electrons are injected from n type emitter region 34 into n type drift layer 32. Correspondingly, positive holes are supplied from p type collector layer 30 into n type drift layer 32. As a result, conductivity modulation takes place in n type drift layer 32, thus significantly decreasing a resistance between emitter electrode 42 and collector electrode 44. In other words, IGBT 90 is brought into ON state.

Meanwhile, when gate electrode 9 is not fed with the above-described potential, no inversion layer is formed in the channel region, thereby maintaining a reverse-bias state between n type drift layer 32 and p type body region 33. Thus, IGBT 90 is in OFF state.

The following describes a method for manufacturing IGBT 90.

Figure 2:
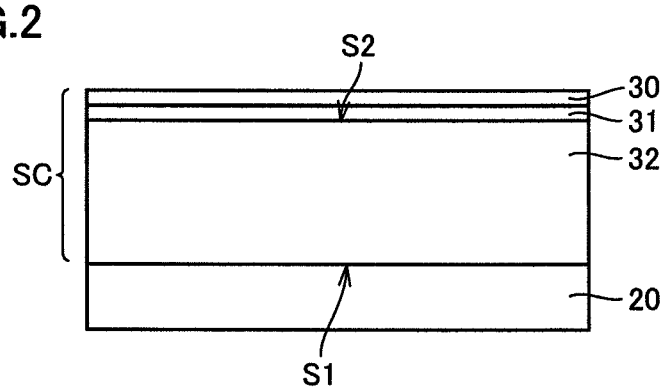
FIG. 2 is a cross sectional view schematically showing a first step in a method for manufacturing the silicon carbide semiconductor device of FIG. 1.

Referring to FIG. 2, an n type single-crystal substrate 20 made of silicon carbide is prepared. Preferably, n type single-crystal substrate 20 has the same crystal structure as that of silicon carbide layer SC (FIG. 1). More preferably, n type single-crystal substrate 20 has a main surface (upper surface in the figure) having a plane orientation opposite to that of surface S1 of silicon carbide layer SC.

Next, n type drift layer 32 made of silicon carbide is formed on n type single-crystal substrate 20. N type drift layer 32 has surface S1 facing n type single-crystal substrate 20, and surface S2 opposite to surface S1. The formation of n type drift layer 32 is performed by epitaxially growing silicon carbide on n type single-crystal substrate 20 while adding a donor type impurity thereto. The epitaxial growth is performed by, for example, a chemical vapor deposition (CVD) method. In the CVD method, a film formation temperature is approximately 1400° C., for example. As a source material gas in the CVD method, a mixed gas of silane ($SiH_4$) and propane ($C_3H_8$) can be used. As the donor type impurity, nitrogen (N) or phosphorus (P) can be used, for example. As a carrier gas for the source material gas, hydrogen gas ($H_2$) can be used, for example.

Next, n type field stop layer 31 is formed on surface S2 of the drift layer. N type field stop layer 31 can be formed using substantially the same method as the method for forming n type drift layer 32.

Next, p type collector layer 30 made of silicon carbide is formed on surface S2 of n type drift layer 32 with n type field stop layer 31 interposed therebetween. N type field stop layer 31 and p type collector layer 30 can be formed by means of the ion implantation method or the epitaxial growth method.

In the case where the ion implantation method is employed, the formation of p type collector layer 30 is performed by implanting ions of an acceptor type impurity into n type field stop layer 31. In the case where no n type field stop layer 31 is provided, the ion implantation is performed into n type drift layer 32 or p type collector layer 30.

In the case where the epitaxial growth method is employed, for example, p type collector layer 30 is formed by means of the CVD method. In the CVD method, a film formation temperature is approximately 1400° C., for example. As a source material gas in the CVD method, a mixed gas of silane ($SiH_4$) and propane ($C_3H_8$) can be used. As the acceptor type impurity, aluminum (Al) or boron (B) can be used, for example. As a carrier gas for the source material gas, hydrogen gas ($H_2$) can be used, for example.

The formation of p type collector layer 30 is performed by epitaxially growing silicon carbide on surface S2 of n type drift layer 32 with n type field stop layer 31 interposed therebetween, while adding an acceptor type impurity thereto. The epitaxial growth is performed by, for example, the CVD method. In the CVD method, a film formation temperature is approximately 1400° C., for example. As a source material gas in the CVD method, a mixed gas of silane ($SiH_4$) and propane ($C_3H_8$) can be used. As the acceptor type impurity, aluminum (Al) or boron (B) can be used, for example. As a carrier gas for the source material gas, hydrogen gas ($H_2$) can be used, for example.

Figure 3:
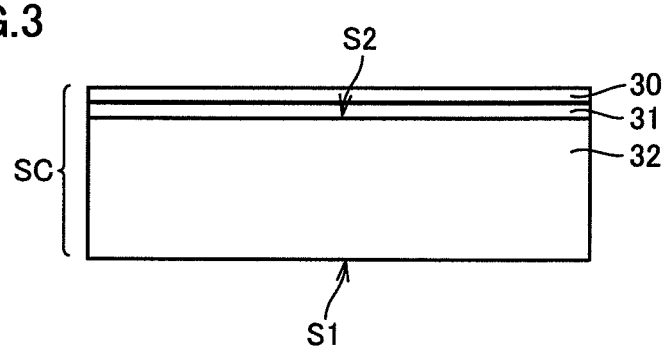
FIG. 3 is a cross sectional view schematically showing a second step in the method for manufacturing the silicon carbide semiconductor device of FIG. 1.

Referring to FIG. 3, at least a portion of n type single-crystal substrate 20 is removed. As a method of removing, a back grind method can be employed, for example. In other words, n type single-crystal substrate 20 can be grinded. Alternatively, an etching method can be employed. As the etching method, reactive ion etching may be employed.

With the removal of n type single-crystal substrate 20, at least a portion of surface S1 of n type drift layer 32 is exposed. Preferably, in order to securely expose at least a portion of surface S1, n type drift layer 32 is removed to some extent on at least a portion of surface S1.

Figure 4:
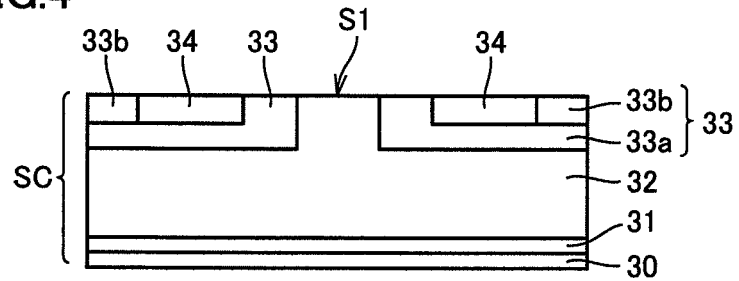
FIG. 4 is a cross sectional view schematically showing a third step in the method for manufacturing the silicon carbide semiconductor device of FIG. 1.

Referring to FIG. 4, there are formed p type body regions 33 each disposed in surface S1 of n type drift layer 32, and n type emitter regions 34 each disposed on p type body region 33 and separated from n type drift layer 32 by p type body region 33. P type body region 33 can be formed by means of, for example, ion implantation of aluminum (Al) or the like. N type emitter region 34 can be formed by means of, for example, ion implantation of phosphorus (P) or the like.

Next, heat treatment is performed to activate the conductive impurities in silicon carbide layer SC. The heat treatment is preferably performed at a temperature of not less than 1500° C. Further, the heat treatment is preferably performed at a temperature of not more than 1900° C. For example, the heat treatment is performed at a temperature of approximately 1700° C. The heat treatment is performed for approximately 30 minutes, for example. The atmosphere of the heat treatment is preferably an inert gas atmosphere, such as Ar atmosphere.

Figure 5:
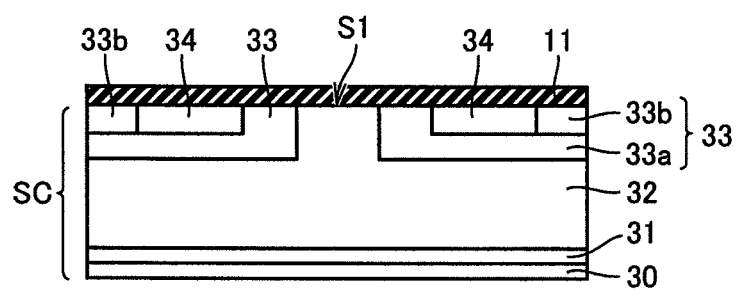
FIG. 5 is a cross sectional view schematically showing a fourth step in the method for manufacturing the silicon carbide semiconductor device of FIG. 1.

Referring to FIG. 5, gate insulating film 11 is formed on a surface of silicon carbide layer SC which includes surface S1. The formation of gate insulating film 11 can be performed by means of, for example, thermal oxidation.

Figure 6:
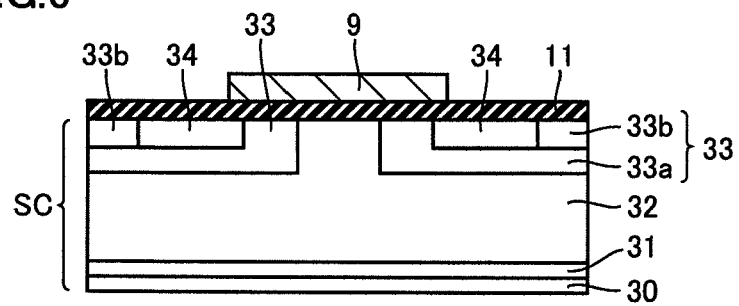
FIG. 6 is a cross sectional view schematically showing a fifth step in the method for manufacturing the silicon carbide semiconductor device of FIG. 1.

Referring to FIG. 6, gate electrode 9 is formed on gate insulating film 11. For example, first, deposition of conductive poly-Si having an impurity added therein is performed by means of the CVD method, or deposition of poly-Si and subsequent addition of an impurity are performed. Next, activation of the impurity and patterning are performed.

Figure 7:
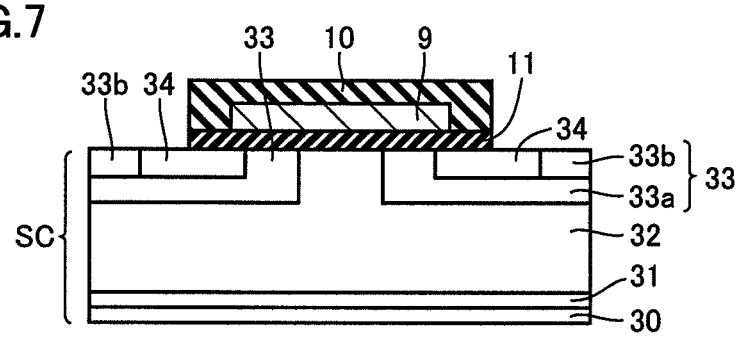
FIG. 7 is a cross sectional view schematically showing a sixth step in the method for manufacturing the silicon carbide semiconductor device of FIG. 1.

Referring to FIG. 7, interlayer insulating film 10 is formed. Further, gate insulating film 11 is patterned to have a remaining portion connecting n type drift layer 32 and n type emitter region 34 to each other on p type body region 33.

Figure 8:
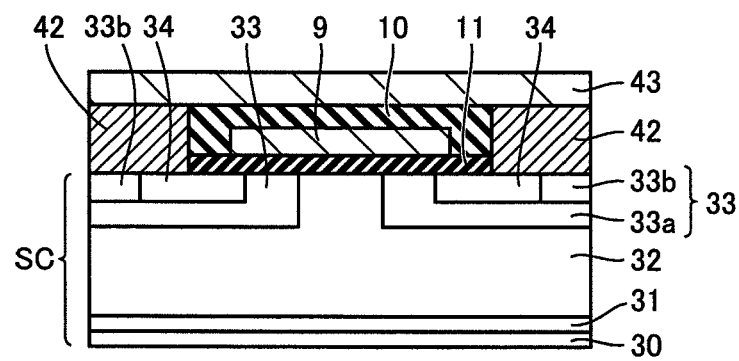
FIG. 8 is a cross sectional view schematically showing a seventh step in the method for manufacturing the silicon carbide semiconductor device of FIG. 1.

Referring to FIG. 8, emitter electrodes 42 are formed which are ohmic electrodes in contact with n type emitter regions 34 and p type body regions 33. Further, emitter wire 43 is formed on emitter electrodes 42. Emitter wire 43 is made of, for example, aluminum.

Referring to FIG. 1 again, collector electrode 44 serving as an ohmic electrode is formed on p type collector layer 30. Further, protecting electrode 15 is formed to cover collector electrode 44. In this way, IGBT 90 is obtained.

According to the present embodiment, p type collector layer 30 is formed on n type single-crystal substrate 20 with n type drift layer 32 interposed therebetween (FIG. 2). Hence, when removing n type single-crystal substrate 20, p type collector layer 30 can be avoided from being partially removed. Accordingly, the thickness of p type collector layer 30 can be avoided from being varied due to variation in the step of removing n type single-crystal substrate 20. In this way, the variation in thickness of p type collector layer 30 in the IGBT can be suppressed. Accordingly, variation of characteristics can be suppressed among IGBTs.

Further, n type single-crystal substrate 20 is made of silicon carbide. Accordingly, both n type single-crystal substrate 20 and n type drift layer 32 formed thereon are made of silicon carbide. This facilitates formation of n type drift layer 32 having higher quality.

Further, n type single-crystal substrate 20 has n type conductivity. Hence, as compared with a case where the single-crystal substrate is of p type, a high-quality substrate can be prepared more readily. Further, n type drift layer 32 has n type conductivity. Hence, as compared with a case where the drift layer is of p type, a high-quality drift layer can be prepared more readily. Further, each of n type single-crystal substrate 20 and n type drift layer 32 has n type conductivity, i.e., the same conductivity type. This facilitates formation of n type drift layer 32 having higher quality on n type single-crystal substrate 20.

Further, because n type drift layer 32 has n type conductivity (first conductivity type), a channel controlled by gate electrode 109 can be of n type. Hence, electrons having higher mobility than positive holes can be employed as carriers in this channel.

In the case where p type collector layer 30 is formed by implanting impurity ions, p type collector layer 30 can be formed using the ion implantation method. The impurity thus implanted can be collectively activated together with the impurity in at least one of each p type body region 33 and each n type emitter region 34.

In the case where p type collector layer 30 is formed by growing silicon carbide while adding a conductive impurity thereto, at least a part of the conductive impurity in p type collector layer 30 can be added without using the ion implantation method.

In the case where n type field stop layer 31 is provided, a depletion layer extending from p type body region 33 to n type drift layer 32 can be suppressed by n type field stop layer 31 from reaching p type collector layer 30.

N type drift layer 32 may have crystallinity higher than that of p type collector layer 30. With such high crystallinity of n type drift layer 32, loss of current flowing in the silicon carbide semiconductor device can be suppressed in n type drift layer 32. The crystallinity can be evaluated based on, for example, half width of a diffraction peak in X-ray diffraction or a half width in a rocking curve.

P type collector layer 30 may have an impurity concentration of $1 \times 10^{18}/cm^3$ or greater. Thus, more sufficient amount of carriers can be supplied from p type collector layer 30 into n type drift layer 32.

In the present embodiment, n type single-crystal substrate 20 is made of silicon carbide, but a substrate made of a different material may be employed. Further, instead of n type single-crystal substrate 20, a p type single-crystal substrate may be used. Further, there may be employed a configuration in which n type conductivity and p type conductivity in the configuration of the present embodiment or a modification thereof are replaced with each other.

In order to form the surface of silicon carbide layer SC to correspond to a specific crystal plane, before forming gate insulating film 11 (FIG. 5), a portion thereof other than its portion to have the specific plane is covered with a mask of $SiO_2$ and the surface of silicon carbide layer SC may be thermally etched, for example. In this way, this surface is spontaneously formed to correspond to the specific crystal plane.

The thermal etching is performed by supplying silicon carbide layer SC with a process gas that can be chemically reacted with silicon carbide, while heating silicon carbide layer SC.

Preferably, the process gas contains an etching gas including chlorine atoms. As such an etching gas, chlorine gas can be employed, for example. Preferably, the process gas contains an oxidizing gas including oxygen atoms. As the oxidizing gas, oxygen gas can be employed, for example. In the case where a mixed gas of oxygen gas and chlorine gas is employed as the process gas, a ratio of flow rate of oxygen to flow rate of chlorine during supply of the mixed gas is preferably not less than 0.1 and not more than 2.0, more preferably, not less than 0.25.

It should be noted that the process gas may contain a carrier gas. As the carrier gas, nitrogen ($N_2$) gas, argon (Ar) gas, helium (He) gas, or the like can be employed, for example.

Further, the heat treatment in the thermal etching is preferably performed at a temperature of not less than 700° C. and not more than 1200° C. With the heat treatment being performed at a temperature of not less than 700° C., a rate of approximately 70 μm/hr can be secured in etching SiC. The lower limit temperature is more preferably 800° C. or greater, further preferably 900° C. or greater. The upper limit temperature is more preferably 1100° C. or smaller, more preferably, 1000° C. or smaller.

It should be noted that a trench having an inclined surface corresponding to the above-described specific plane may be formed by thermal etching. For example, when an $n^+$ region, a p type body region, and an n type drift layer are provided at this inclined surface, a trench type IGBT having a channel on this inclined surface can be fabricated.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a silicon carbide semiconductor device, comprising the steps of:
   forming a drift layer on a single-crystal substrate, said drift layer having a first surface facing said single-crystal substrate and a second surface opposite to said first surface, said drift layer being made of silicon carbide and having first conductivity type;
   forming a collector layer on said second surface of said drift layer, said collector layer being made of silicon carbide and having second conductivity type;
   exposing said first surface of said drift layer by removing said single-crystal substrate;
   forming a body region and an emitter region, said body region being disposed in said first surface of said drift layer and having the second conductivity type different from said first conductivity type, said emitter region being disposed on said body region, being separated from said drift layer by said body region, and having said first conductivity type;
   forming a gate insulating film on said body region so as to connect said drift layer and said emitter region to each other;
   forming a gate electrode on said gate insulating film; and
   forming an emitter electrode in contact with each of said emitter region and said body region.

2. The method for manufacturing the silicon carbide semiconductor device according to claim 1, wherein said single-crystal substrate is made of silicon carbide.

3. The method for manufacturing the silicon carbide semiconductor device according to claim 2, wherein said single-crystal substrate has the first conductivity type.

4. The method for manufacturing the silicon carbide semiconductor device according to claim 2, wherein said first conductivity type is n type.

5. The method for manufacturing the silicon carbide semiconductor device according to claim 1, wherein the step of forming said collector layer includes the step of implanting impurity ions.

6. The method for manufacturing the silicon carbide semiconductor device according to claim 1, wherein the step of forming said collector layer includes the step of growing silicon carbide while adding a conductive impurity to the silicon carbide.

7. The method for manufacturing the silicon carbide semiconductor device according to claim 1, further comprising the step of forming a field stop layer on said second surface of said drift layer, said field stop layer having the first conductivity type and having an impurity concentration higher than that of said drift layer, wherein by the step of forming said field stop layer and the step of forming said collector layer, said field stop layer is formed to be disposed on said drift layer and said collector layer is formed to be disposed on said field stop layer.

8. The method for manufacturing the silicon carbide semiconductor device according to claim 1, wherein said drift layer has crystallinity higher than that of said collector layer.

9. The method for manufacturing the silicon carbide semiconductor device according to claim 1, wherein said collector layer has an impurity concentration of $1 \times 10^{18}/cm^3$ or greater.

* * * * *